(12) United States Patent
Ogawa et al.

(10) Patent No.: US 7,804,066 B2
(45) Date of Patent: Sep. 28, 2010

(54) CHARGED-PARTICLE BEAM APPARATUS

(75) Inventors: Takashi Ogawa, Chiba (JP); Hiroto Muto, Chiba (JP)

(73) Assignee: SII NanoTechnology Inc., Chiba (JP)

( * ) Notice: Subject to any disclaimer, the term of this patent is extended or adjusted under 35 U.S.C. 154(b) by 162 days.

(21) Appl. No.: 12/177,563

(22) Filed: Jul. 22, 2008

(65) Prior Publication Data

US 2009/0008572 A1    Jan. 8, 2009

Related U.S. Application Data

(63) Continuation of application No. PCT/JP2007/050190, filed on Jan. 11, 2007.

(30) Foreign Application Priority Data

Jan. 25, 2006    (JP)    ............................. 2006-016159

(51) Int. Cl.
   *G01N 23/00*    (2006.01)
   *G21K 7/00*    (2006.01)
(52) U.S. Cl. .................... 250/306; 250/310; 250/311
(58) Field of Classification Search ............... 250/306, 250/310, 311, 441.11, 396 ML, 396 R
   See application file for complete search history.

(56) References Cited

U.S. PATENT DOCUMENTS 5,111,054 A * 5/1992 Slingerland ............ 250/441.11

(Continued)

FOREIGN PATENT DOCUMENTS

JP    58-23158 U    2/1983

(Continued)

OTHER PUBLICATIONS

International Search Report issued Mar. 20, 2007 in International application No. PCT/JP2007/050190.

*Primary Examiner*—Jack I Berman
*Assistant Examiner*—Brooke Purinton
(74) *Attorney, Agent, or Firm*—Brinks Hofer Gilson & Lione

(57) ABSTRACT

Provided is a charged-particle beam apparatus capable of preventing a small amount of dust from being attached to an electrostatic lens serving as an objective lens to apply a high voltage to the electrostatic lens.

The charged-particle beam apparatus 1 includes a chamber 2 which has an interior 2a evacuated by an intra-chamber evacuating means 4, and a lens-barrel 3 which emits a charged-particle beam B1 onto a sample S put in the interior 2a of the chamber 2. The lens-barrel 3 includes a cylindrical body 5 which includes an emission outlet 6 for emission of the charged-particle beam B1, a charged-particle supply part 7 which is housed at a side of a proximal end 5b in an interior 5a of the cylindrical body 5 and releases the charged-particle beam B1, and an objective lens 11 which is housed at a side of a distal end 5b in the interior 5b of the cylindrical body 5 and has an electrostatic lens for generating an electric field and converging the charged-particle beam B1 released from the charged-particle supply part 7. The cylindrical body 5 of the lens-barrel 3 is provided with a gas supplying means 12 capable of supplying a gas G to the interior 5b of the cylindrical body 5, and the gas supplying means 12 is provided at a side of a proximal end of the objective lens 11.

9 Claims, 3 Drawing Sheets

U.S. PATENT DOCUMENTS

| | | | |
|---|---|---|---|
| 5,442,183 A * | 8/1995 | Matsui et al. | 250/441.11 |
| 5,828,064 A * | 10/1998 | Knowles | 250/310 |
| 5,869,833 A * | 2/1999 | Richardson et al. | 250/310 |
| 5,949,076 A * | 9/1999 | Ohtoshi et al. | 250/396 R |
| 6,207,117 B1 * | 3/2001 | Takamatsu et al. | 250/441.11 |
| 6,555,815 B2 * | 4/2003 | Feuerbaum et al. | 250/306 |
| 6,653,631 B2 * | 11/2003 | Nishimura | 250/306 |
| 6,829,034 B2 * | 12/2004 | Miwa et al. | 250/441.11 |
| 6,872,956 B2 | 3/2005 | Gnauck et al. | |
| 7,601,972 B2 * | 10/2009 | Nakasuji et al. | 250/441.11 |
| 2005/0121611 A1 * | 6/2005 | Kimba et al. | 250/311 |
| 2006/0016988 A1 * | 1/2006 | Petrov et al. | 250/441.11 |
| 2006/0118719 A1 | 6/2006 | Watanabe et al. | |
| 2008/0173814 A1 * | 7/2008 | Watanabe et al. | 250/310 |

FOREIGN PATENT DOCUMENTS

| | | |
|---|---|---|
| JP | 6-188182 A | 7/1994 |
| JP | 9-63525 A | 3/1997 |
| JP | 2002-251976 A | 9/2002 |

* cited by examiner

[Fig. 1]
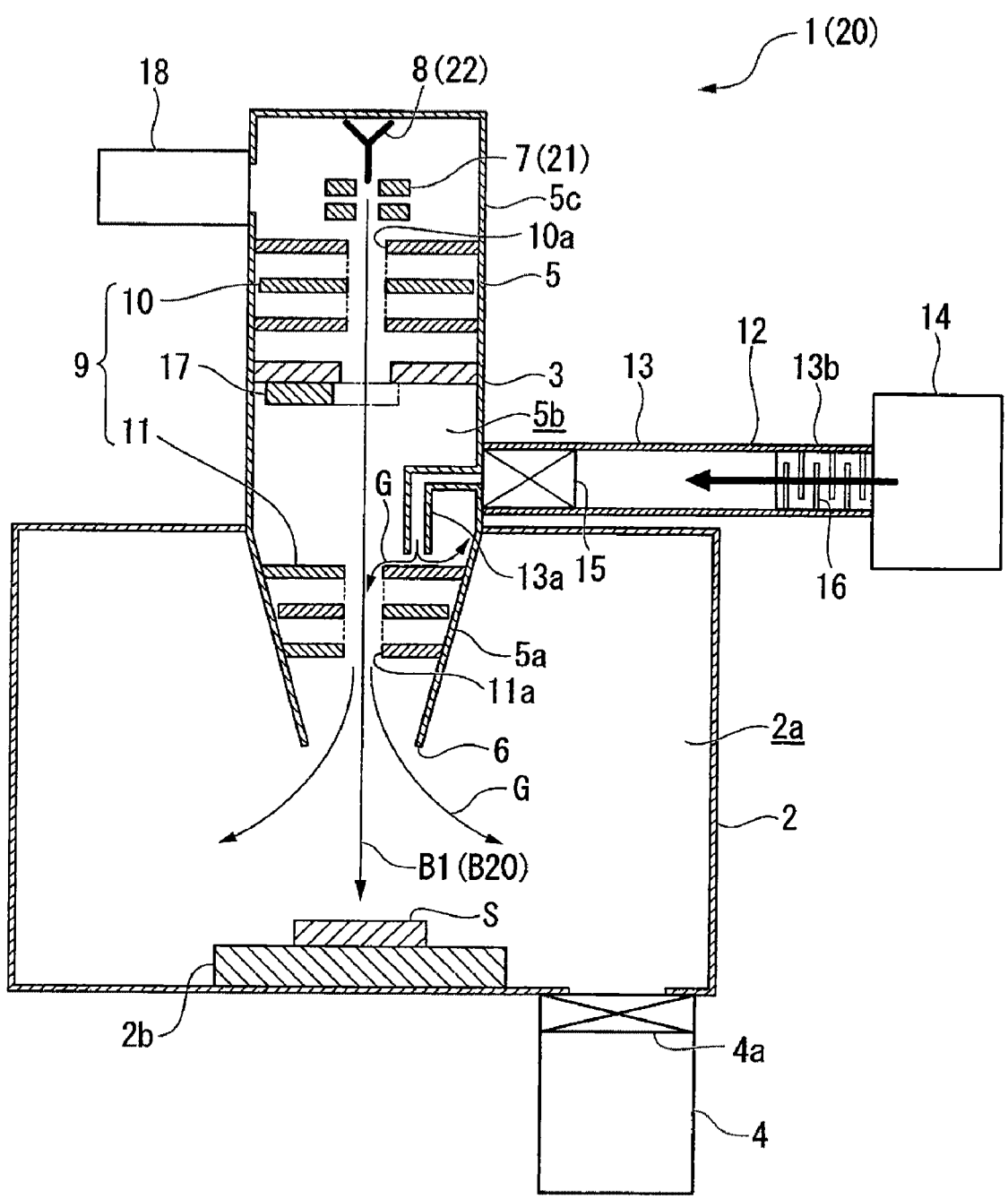

[Fig. 2]
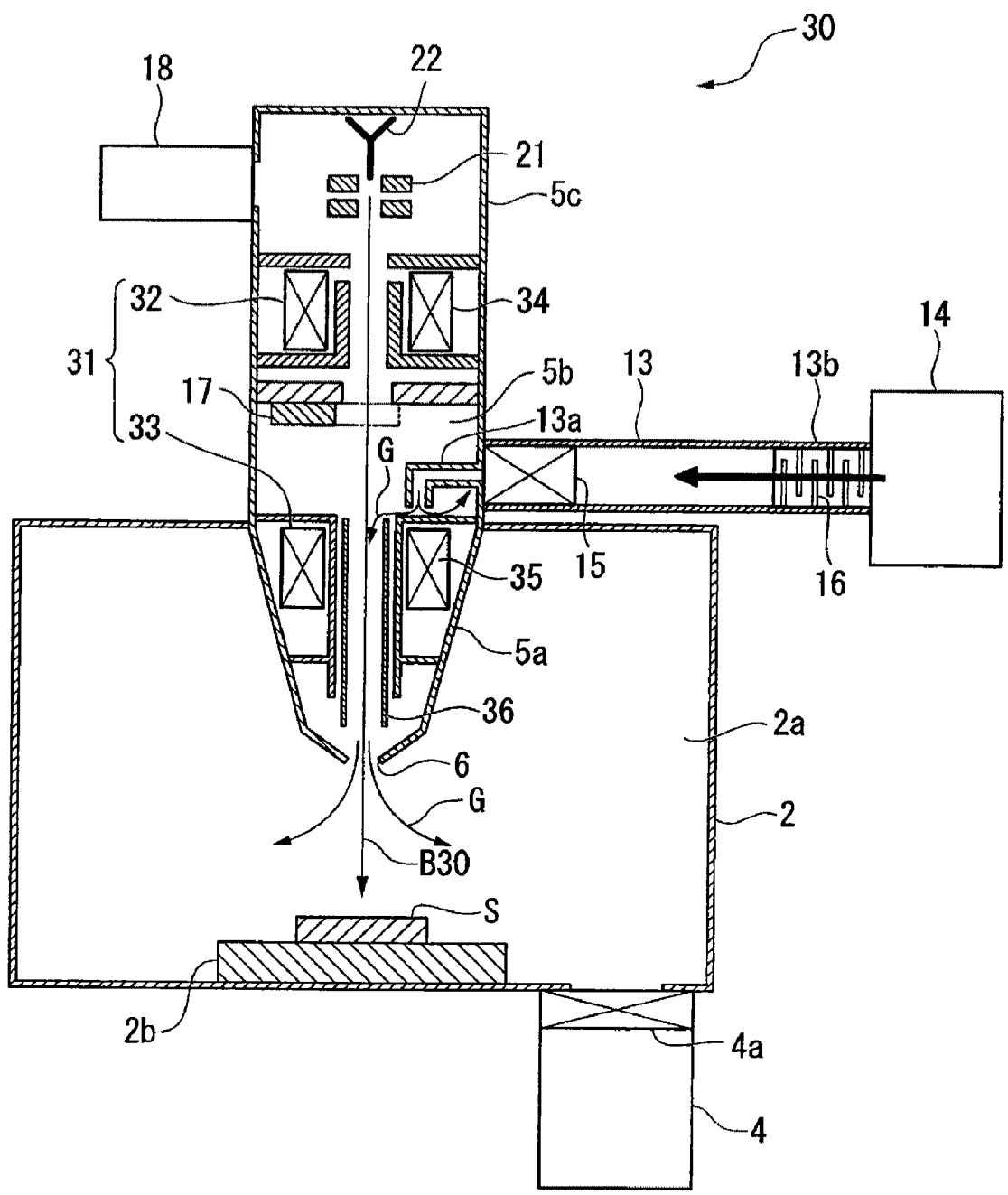

[Fig. 3 - Prior Art]
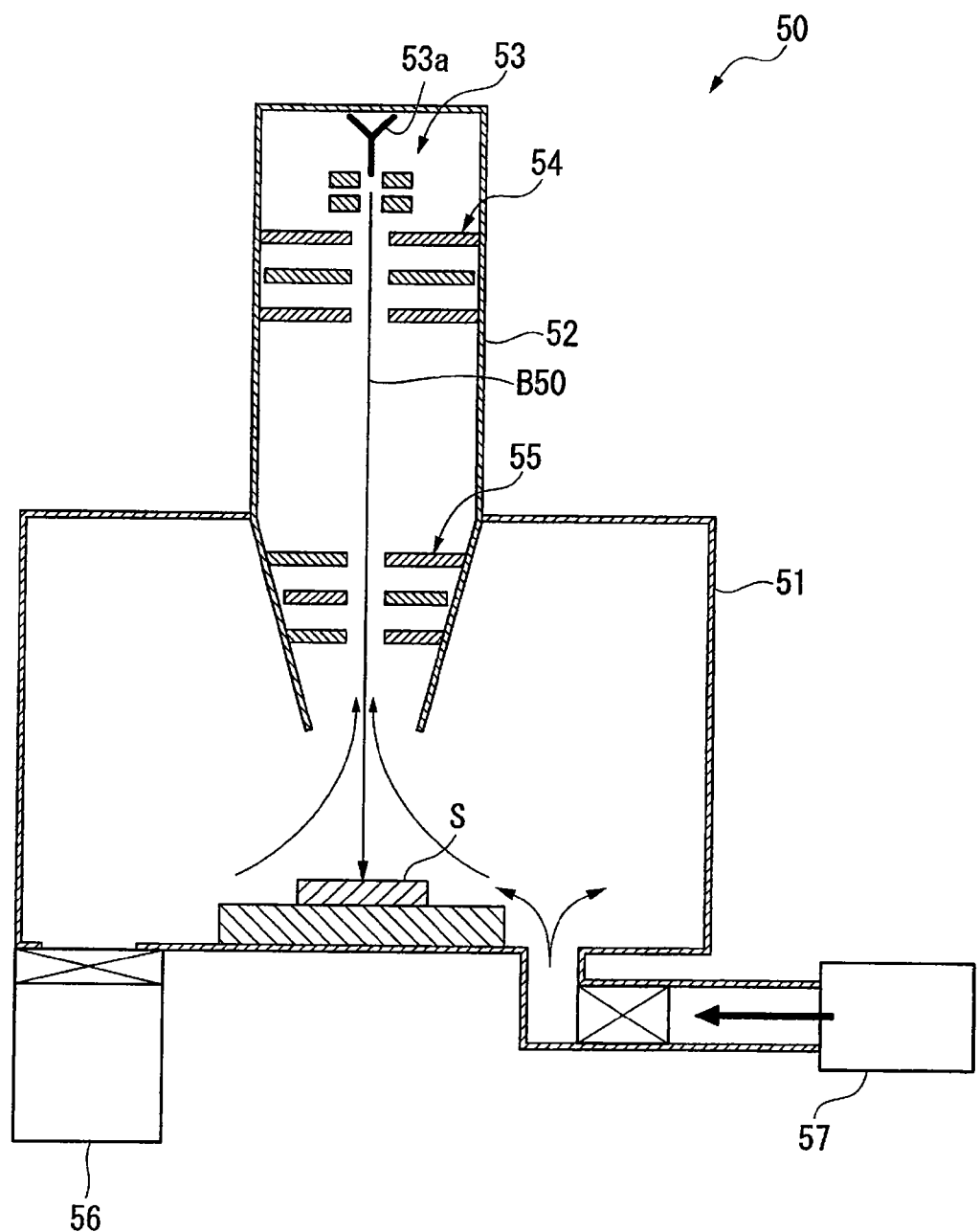

US 7,804,066 B2

CHARGED-PARTICLE BEAM APPARATUS

RELATED APPLICATIONS

This application is a continuation of PCT/JP2007/050190, filed on Jan. 11, 2007, which claims priority to Japanese Application No. JP2006-016159, filed on Jan. 25, 2006. The entire contents of these applications are incorporated herein by reference.

TECHNICAL FIELD

The present invention relates to a charged-particle beam apparatus for emitting a charged-particle beam onto a sample to fabricate or observe the sample.

BACKGROUND ART

Conventionally, there has been proposed a charged-particle beam apparatus for emitting a charged-particle beam onto a sample in a vacuum atmosphere to fabricate or observe a surface of the sample. FIG. 3 schematically shows a charged-particle beam apparatus 50 as described above. The charged-particle beam apparatus 50 includes a chamber 51 in which a sample S is placed, and a lens-barrel 52 for directing a charged-particle beam B onto the sample S placed in the chamber 51. The lens-barrel 52 includes a charged-particle supplier 53 having a charged-particle source 53a, a condenser lens 54 and an objective lens 55 each serving as an electrostatic lens to which a voltage can be applied. Moreover, the chamber 51 is provided with an evacuating means 56 capable of evacuating the chamber 51, and a gas supplier 57 capable of supplying a gas such as $N_2$ into the chamber 51. In the charged-particle beam apparatus 50 described above, a voltage is applied to the objective lens 55 in such a manner that the evacuating means 56 creates a high vacuum atmosphere inside the chamber 51 and the lens-barrel 52. In this state, a charged particle drawn from the charged-particle source 53a of the charged-particle supplier 53 is accelerated, and then is emitted as a charged-particle beam B50. Then, the released charged-particle beam 50B is converged by electric fields formed by the condenser lens 54 and the objective lens 55, respectively, and is irradiated onto the sample S, so that a surface of the sample S is subjected to fabrication or observation. As described above, after the completion of fabrication or observation of the sample S, the sample S is transported to the outside through a sample transport opening (not shown). Herein, in each of the interior of the chamber 51 and the interior of the lens-barrel 52, a high vacuum atmosphere is created. Consequently, when the sample transport opening is open, a large amount of outside dust disadvantageously enters each interior in addition to outside air. In order to avoid such a disadvantage, the chamber 51 and the lens-barrel 52 are filled with a gas by the gas supplying means 57 at a nearly atmospheric pressure, and then the sample S is transported to the outside through the sample transport opening As an example of the charged-particle beam apparatus 50 described above, more specifically, there is a focused ion beam apparatus that emits an ion beam to a sample with the use of an ion source serving as a charged-particle source (refer to, e.g., Japanese Unexamined Patent Publication No. 2002-251976). The focused ion beam apparatus 50 described above has an advantage that an ion beam is emitted to a sample in order to etch a surface of the sample or an assist gas is supplied to the sample simultaneously with the emission of the ion beam, so that a deposition is formed on the surface of the sample. As another example, moreover, there is a scanning electron microscope that emits an electron beam, which has been drawn from an electron source serving as a charged-particle source and then has been accelerated, to a sample to observe a surface of the sample. With regard to these charged-particle beams, when a high voltage is applied to an electrostatic lens used as an objective lens, optical aberration becomes small. As a result, the charged-particle beam can be converged effectively. When the charged-particle beam is converged effectively as described above, the focused ion beam apparatus can fabricate the surface of the sample more precisely. On the other hand, the scanning electron microscope can obtain an observation image at a high resolution. Recently, a sample to be fabricated or observed tends to become finer. In order to fabricate and observe such a sample more precisely, therefore, there has been proposed a method of applying a higher voltage to an electrostatic lens to fabricate or observe the sample.

However, the application of a higher voltage to the electrostatic lens causes the following problem. That is, when dust is attached to the electrostatic lens, even if the attached dust is in such a small amount as to not pose any problem in the conventional art, electric discharge occurs at the electrostatic lens. As described above, conventionally, when a sample is transported from the chamber to the outside, the gas supplying means supplies a gas to the chamber to prevent outside dust from entering the chamber. However, it is impossible to prevent the dust from entering completely. In addition, since dust is also attached to the sample, a small amount of dust always exists in the chamber. When the gas supplying means supplies the gas into the chamber to create a high vacuum atmosphere, such dust is stirred up together with the gas, and then is flown into the lens-barrel. Herein, the dust is attached to the objective lens, resulting in electric discharge.

The present invention has been devised in view of the circumstances described above. An object of the present invention is to provide a charged-particle beam apparatus capable of preventing a small amount of dust from being attached to an electrostatic lens serving as an objective lens to apply a high voltage to the electrostatic lens.

SUMMARY OF THE INVENTION

In order to solve the foregoing problems, the present invention offers the following configurations.

The present invention provides a charged-particle beam apparatus including: a chamber having an interior evacuated by an intra-chamber evacuating means; and a lens-barrel emitting a charged-particle beam onto a sample placed in the chamber. Herein, the lens-barrel includes: a cylindrical body having a distal end at which an emission outlet is formed for communication with the chamber and from which the charged-particle beam is released; a charged-particle supplier housed at a side of a proximal end in an interior of the cylindrical body to release the charged-particle beam; and an objective lens housed at a side of a distal end in the interior of the cylindrical body and having an electrostatic lens generating an electric field by voltage application and converging the charged-particle beam released from the charged-particle supply part. In the cylindrical body of the lens-barrel, a gas supplying means supplying a gas into the cylindrical body is provided at a side of a proximal end of the objective lens.

In the charged-particle beam apparatus according to the present invention, the chamber is filled with the gas in such a manner that the gas supplying means supplies the gas from the proximal end side of the objective lens in the cylindrical body. With this configuration, first, the gas raises an atmospheric pressure in the cylindrical body filled with the gas, and then is flown into the chamber through the emission outlet of the cylindrical body, so that the chamber is filled with the gas. More specifically, the gas supplied from the gas supplying means is flown into the chamber from the cylindrical body in which the electrostatic lens serving as the objective lens is housed. This configuration prevents a small amount of dust existing in the chamber from being stirred up and prevents the dust from being attached to the electrostatic lens. Therefore, even when a high voltage is applied to the electrostatic lens, no electric discharge occurs. The electrostatic lens can effectively converge the charged-particle beam released from the charged-particle supply part and, then, can emit the converged charged-particle beam to the sample put in the chamber.

In the charged-particle beam apparatus described above, preferably, the gas supplying means includes: a gas supply pipe having a distal end provided at the proximal end side of the objective lens; a gas supplier connected to a proximal end of the gas supply pipe to supply the gas; and a gas supply valve controlling an open/close state of the gas supply pipe.

In the charged-particle beam apparatus according to the present invention, when the gas supply valve is opened, the gas supplied from the gas supplier is released through the supply pipe toward the proximal end side of the objective lens at which the distal end of the supply pipe is provided.

In the charged-particle beam apparatus described above, preferably, the gas supply pipe of the gas supplying means is provided with a filter removing dust mixed in the gas supplied from the gas supplier.

In the charged-particle beam apparatus according to the present invention, the filter of the gas supply pipe can remove a small amount of dust mixed in the gas supplied from the gas supplier, leading to more reliable prevention of electric discharge at the electrostatic lens serving as the objective lens.

In the charged-particle beam apparatus described above, preferably, in the gas supply pipe of the gas supplying means, at least the distal end arranged inside the cylindrical body is made of metal.

In the charged-particle beam apparatus according to the present invention, the distal end of the gas supply pipe is made of metal. This configuration prevents the distal end of the gas supply pipe from being degassed in a high vacuum atmosphere and maintains the interior of the chamber and the interior of the cylindrical body at a high vacuum state.

In the charged-particle beam apparatus described above, preferably, in the gas supply pipe of the gas supplying means, at least the distal end arranged inside the cylindrical body is subjected to vacuum baking.

In the charged-particle beam apparatus according to the present invention, the distal end of the gas supply pipe is subjected to vacuum baking. This configuration prevents the distal end of the gas supply pipe from being degassed in the high vacuum atmosphere and maintains the interior of the chamber and the interior of the cylindrical body at the high vacuum state.

Preferably, the charged-particle beam apparatus described above further includes: a cylindrical body valve interposed between the gas supplying means and the charged-particle supply part to control an open/close state of each of the distal end side and the proximal end side in the cylindrical body; and a supply part evacuating means provided at the proximal end side of the cylindrical body to maintain the proximal end side of the cylindrical body, in which the charged-particle supply part is housed, at an ultra high vacuum state which is higher than a vacuum state of the chamber.

In the charged-particle beam apparatus according to the present invention, at the time when the gas is supplied by the gas supplying means, the cylindrical body valve is closed. This configuration prevents the gas from being flown into the proximal end side of the cylindrical body in which the charged-particle supplier is housed. This configuration evacuates the proximal end side of the cylindrical body with the use of the supply part evacuating means different from the intra-chamber evacuating means in the state that the cylindrical body valve is closed. Therefore, this configuration efficiently evacuates the chamber and the cylindrical body upon fabrication or observation of the sample and to maintain the proximal end side of the cylindrical body at the ultra-high vacuum state. After completion of the fabrication or observation, further, this configuration efficiently supplies the gas with the use of the gas supplying means within a gas supply area set so as to be minimum.

In the charged-particle beam apparatus described above, preferably, the objective lens further has a magnetic field lens generating a magnetic field so as to superimpose the magnetic field on the electric field generated by the electrostatic lens and converging the charged-particle beam.

In the charged-particle beam apparatus according to the present invention, the electrostatic lens generates the electric field, and the magnetic field lens generates the magnetic field so as to superimpose the magnetic field on the electric field. This configuration effectively converges the charged-particle beam.

In the charged-particle beam apparatus according to the present invention, the gas supplying means for supplying the gas into the chamber and the cylindrical body of the lens-barrel is provided at the proximal end side with respect to the objective lens. This configuration prevents dust, no matter how small amount it is of, from being attached to the electrostatic lens serving as the objective lens. Therefore, this configuration prevents electric discharge occurring due to the small amount of dust even when a high voltage is applied to the electrostatic lens and effectively converges the charged-particle beam to be emitted to the sample.

BRIEF DESCRIPTION OF THE DRAWINGS

FIG. 1 shows a configuration of a charged-particle beam apparatus according to a first embodiment of the present invention.

FIG. 2 shows a configuration of a charged-particle beam apparatus according to a second embodiment of the present invention.

FIG. 3 shows a configuration of a conventional charged-particle beam apparatus.

DETAILED DESCRIPTION OF THE PREFERRED EMBODIMENT

First Embodiment

FIG. 1 shows a first embodiment according to the present invention. As shown in FIG. 1, a focused ion beam apparatus (FIB) 1 serving as a charged-particle beam apparatus emits an ion beam B1 serving as a charged-particle beam to a sample S to fabricate a surface of the sample S. For example, a wafer is placed in the apparatus as the sample S to prepare a sample for observation using a TEM (Transmission Electron Microscope). Moreover, a photomask in photolithography is used as the sample S in order to correct the photomask. Hereinafter, detailed description will be given of the focused ion beam apparatus 1 according to this embodiment.

As shown in FIG. 1, the focused ion beam apparatus 1 includes a chamber 2 having an interior 2a in which a sample stage 2b is disposed, and a lens-barrel 3 emitting the ion beam B1 to the sample S placed on the sample stage 2b. The chamber 2 is provided with an intra-chamber evacuating means 4 evacuating the interior 2a of the chamber 2 to set the interior at a high vacuum atmosphere. The intra-chamber evacuating means 4 is a vacuum pump such as a rotary pump or a turbo pump, and can control an open/close state using an evacuation valve 4a.

Moreover, the lens barrel 3 includes a cylindrical body 5 having a distal end 5a at which an emission outlet 6 is formed for communication with the chamber 2, and an ion supplier 7 serving as a charged-particle supplier housed at a side of a proximal end 5c in an interior 5b of the cylindrical body 5. The ion supplier 7 includes an ion source 8 for supplying an ion, draws the ion from the ion source 8 and accelerates the ion to release the ion beam B1. Examples of the ion from the ion source 8 may include a gallium ion ($Ga^+$) and the like. In the interior 5b of the cylindrical body 5, moreover, an optical system 9 for converging the ion beam B1 released from the ion supplier 7 is provided at a side of a distal end with respect to the ion supplier 7. The optical system 9 includes a condenser lens 10 and an objective lens 11. The condenser lens 10 is disposed at the distal end side with respect to the ion supplier 7 to converge the ion beam B1 released from the ion supplier 7. On the other hand, the objective lens 11 is disposed at the further distal end side with respect to the condenser lens 10 to further converge the ion beam B1 converged by the condenser lens 10 and, then, to emit the converged ion beam B1 to a predetermined emission position of the sample S. The condenser lens 10 is formed by three electrodes each having a through hole 10a formed at a center thereof such that the ion beam B1 passes through the through holes 10a and, also, the objective lens 11 is formed by three electrodes each having a through hole 11a formed at a center thereof such that the ion beam B1 passes through the through holes 11a. Then, the intermediate electrode is changed in potential with respect to the remaining two electrodes, so that an electric field is generated inside each of the through hole 10a and the through hole 11a to converge the ion beam B1 passing therethrough. Although not shown in the figure, a blanking electrode, a deflection electrode or the like may further be provided as the optical system 9.

As shown in FIG. 1, moreover, a gas supplying means 12 is provided at a side of a proximal end of the objective lens 11. The gas supplying means 12 includes a gas supply pipe 13 having a distal end 13a provided at the proximal end side of the objective lens 11, and a gas supplier 14 connected to a proximal end 13b of the gas supply pipe 13 to supply a gas G. The gas G is $N_2$, for example. Preferably, the gas G is a dry gas made of an inert substance. In the gas supply pipe 13, the distal end 13a disposed on the interior 5b of the cylindrical body 5 is made of metal subjected to vacuum baking, and is electrically connected to the cylindrical body 5 at a potential identical with that of the cylindrical body 5. Herein, the term "vacuum baking" refers to a process of baking metal at a temperature of about 150° C. under a vacuum atmosphere in order to degas the material to be processed. In addition, the gas supply pipe 13 is provided with a gas supply valve 15 capable of controlling an open/close state of the gas supply pipe 13, and a filter 16 capable of removing dust mixed in the gas G supplied from the gas supplier 14. In the interior 5b of the cylindrical body 5, further, a cylindrical body valve 17 capable of controlling an open/close state of each of the distal end 5a side and the proximal end 5b side is provided between the distal end 13a of the gas supply pipe 13 and the condenser lens 10, and a supply part evacuating means 18 is provided at the proximal end 5c side so as to adjoin to the ion supplier 7.

The supply part evacuating means 18 is an ion pump, for example, and can maintain the proximal end 5c, in which the ion supplier 7 is housed, in the interior 5b of the cylindrical body 5 at a degree of vacuum higher than the vacuum state in the chamber 2.

Next, description will be given of action of the focused ion beam apparatus 1. As shown in FIG. 1, first, the sample S is placed on the sample stage 2b. Then, the interior 2a of the chamber 2 and the interior 5b of the cylindrical body 5 are evacuated so as to be set at the high vacuum atmosphere. That is, in a state that the cylindrical body valve 17 is closed, the intra-chamber evacuating means 4 evacuates the interior 2a of the chamber 2 and the distal end 5a side of the interior 5b of the cylindrical body 5. Further, the supply part evacuating means 18 evacuates the proximal end 5c side of the cylindrical body 5. As described above, when the cylindrical body valve 17 is closed, the evacuation by each of the intra-chamber evacuating means 4 and the supply part evacuating means 18 can be performed efficiently. Herein, the distal end 13a of the gas supply pipe 13 is made of metal subjected to vacuum baking. This configuration prevents degassing from the distal end 13a of the gas supply pipe 13 in the high vacuum atmosphere and maintains each of the interior 2a of the chamber 2 and the interior 5b of the cylindrical body 5 at a high vacuum state. In this state, then, the cylindrical body valve 17 is opened to start fabrication of the sample S with the use of the ion beam B1. That is, a voltage is applied to each of the condenser lens 10 and the objective lens 11 in the optical system 9 to generate an electric field at each of the through hole 10a and the through hole 11a. Then, the ion beam B1, which has been drawn from the ion source 8 of the ion supplier 7 and has been accelerated, is converged by the condenser lens 10 and, further, is converged by the objective lens 11. Thus, the converged ion beam B1 is emitted to the predetermined emission position of the sample S. A deflecting means (not shown) allows the converged ion beam B1 to scan the sample S to detect secondary charged particles (not shown). Thus, a user can observe the surface of the sample. In addition, the scanning of a predetermined area on the sample S allows fabrication of the sample S.

After completion of the fabrication of the sample S, next, the sample S is transported to the outside from the chamber 2 through a sample transport opening (not shown). First, the cylindrical body valve 17 is closed and, further, each of the interior 2a of the chamber 2 and the interior 5b of the cylindrical body 5 is filled with the gas G by the gas supplying means 13 so as to be set at an atmospheric pressure, so that outside dust is prevented from entering the chamber 2 and the cylindrical body 5 through the sample transport opening. More specifically, the gas supply valve 15 of the gas supplying means 13 is opened in order to supply the gas G from the gas supplier 14 to the proximal end side of the objective lens 11 through the filter 16. In the interior 5b of the cylindrical body 5, then, the distal end 5a side with respect to the cylindrical valve 17 is filled with the gas G supplied as described above, so that an atmospheric pressure increases in the interior 5b of the cylindrical body 5. Further, the gas G is flown into the chamber 2 through the emission outlet 6 of the cylindrical body 5, so that the interior 2a of the chamber 2 is filled with the gas G. As described above, the gas G supplied from the gas supplying means 12 is flown toward the chamber 2 from the cylindrical body 5 in which an electrostatic lens serving as the objective lens 11 is housed. This configuration brings about the following advantage. That is, even when a small amount of dust exists in the interior 2a of the chamber 2, the gas prevents the dust from being stirred up. As a result, there is no possibility that the dust is attached to the electrostatic lens serving as the objective lens 11.

As described above, the provision of the gas supplying means 12 at the proximal end side with respect to the objective lens 11 prevents electric discharge occurring at the electrostatic lens due to a small amount of dust. Therefore, a higher voltage is applied to the electrostatic lens serving as the objective lens 11, so that the ion beam B1 to be emitted to the sample S can be emitted to the sample S while being converged effectively. Thus, the sample S can be fabricated more precisely. In addition, the provision of the filter 16 at the gas supplying means 12 allows removal of a small amount of dust mixed in the gas G supplied from the gas supplier 14. This configuration prevents electric discharge from occurring at the electrostatic lens serving as the objective lens 11 more accurately. Further, the provision of the cylindrical body valve 17 and the supply part evacuating means 18 allows efficient evacuation of the interior 2a of the chamber 2 and the interior 5b of the cylindrical body 5 upon fabrication of the sample S. Moreover, upon supply of the gas G by the gas supplying means 12, the gas G is prevented from being flown into the proximal end 5c side of the cylindrical body 5 in which the ion supplier 7 is housed. Thus, a gas supply range is set at a minimum level in order to efficiently supply the gas.

As shown in FIG. 1, a scanning electron microscope (SEM) 20 in which an electron supplier 21 corresponds to the charged-particle supplier may be a charged-particle beam according to a modification of this embodiment in such a manner that an electron source 22 is used in place of the ion source 8. In such a scanning electron microscope 20, similarly, a gas supplying means 12 is provided at a proximal end side with respect to an objective lens 11; therefore, a higher voltage can be applied to each of a condenser lens 10 and the objective lens 11. As a result, an electron beam B20 released from the electron supplier 21 can be emitted to a sample S while being converged effectively, so that an observation image at high resolution can be obtained.

Second Embodiment

FIG. 2 shows a second embodiment according to the present invention. In this embodiment, members equal to those used in the foregoing embodiment are denoted by identical reference symbols; therefore, description thereof will not be given here.

As shown in FIG. 2, a scanning electron microscope (SEM) 30 serving as a charged-particle beam apparatus includes, as an optical system 31, a condenser lens 32 and an objective lens 33. The condenser lens 32 has a coil 34 functioning as a magnetic field lens. On the other hand, the objective lens 33 has a coil 35 functioning as a magnetic field lens, and an electrode 36 functioning as an electrostatic lens inserted into the coil 35. In the condenser lens 32, an electric current is fed to the coil 34 to generate a magnetic field. In the objective lens 33, on the other hand, a voltage is applied to the electrode 36 to generate an electric field and an electric current is fed to the coil 35 to generate a magnetic field so as to superimpose the magnetic field on the electric field. That is, an electron beam B30 released from an electron supplier 21 is converged by generation of the magnetic field at the condenser lens 32. Further, the electric field and the magnetic field functioned in a superimposed manner at the objective lens 33 can converge the electron beam B30 serving as the charged-particle beam more effectively by combination with an advantage obtained in such a manner that a gas supplying means 12 is provided at a proximal end side of the objective lens 33.

Although the embodiments of the present invention have been described in detail with reference to the drawings, the specific configuration is not limited to these embodiments. It is therefore understood that numerous modifications and variations can be devised without departing from the scope of the present invention.

In the foregoing embodiments, the focused ion beam apparatus and the scanning electron microscope are described as an example of the charged-particle beam apparatus; however, the present invention is not limited thereto. For example, the charged-particle beam apparatus according to the present invention may be an FIB/SEM system including both a lens-barrel for emission of an ion beam and a lens-barrel for emission of an electron beam. Advantages similar to those described above can be expected as long as the charged-particle beam apparatus according to the present invention is an apparatus that allows an electrostatic lens to converge at least a charged-particle beam obtained by acceleration of a charged particle. In the foregoing embodiments, moreover, the condenser lens and the objective lens are used as an optical system for converging a charged-particle beam; however, the present invention is not limited to this example. A configuration that an objective lens is attached to at least a distal end side of a cylindrical body of a lens-barrel is allowed to converge a charged-particle beam and, then, to emit the converged charged-particle beam to a predetermined emission position of a sample.

In the charged-particle beam apparatus, the gas supplying means for supplying a gas into the chamber and the cylindrical body of the lens-barrel is provided at the proximal end side with respect to the objective lens; therefore, a small amount of dust can be prevented from being attached to the electrostatic lens serving as the objective lens. As a result, even when a high voltage is applied to the electrostatic lens, the charged-particle beam apparatus according to the present invention can prevent occurrence of electric discharge due to a small amount of dust and can effectively converge a charged-particle beam to be emitted to a sample.

The invention claimed is:

1. A charged-particle beam apparatus comprising:
   a chamber having an interior evacuated by an intra-chamber evacuating means; and
   a lens-barrel emitting a charged-particle beam onto a sample placed in the chamber,
   wherein the lens-barrel comprises:
   a cylindrical body having a distal end at which an emission outlet is formed for communication with the chamber and from which the charged-particle beam is released;
   a charged-particle supplier housed at a side of a proximal end in an interior of the cylindrical body to release the charged-particle beam; and
   an objective lens housed at a side of a distal end in the interior of the cylindrical body and having an electrostatic lens generating an electric field by voltage application and converging the charged-particle beam released from the charged-particle supplier, and
   a gas supplying means in the cylindrical body of the lens-barrel for supplying an inert gas into the cylindrical body at a side of a proximal end of the objective lens and configured to provide an inert gas pressure in the chamber sufficient to substantially prevent dust present in the chamber from contact with the objective lens.

2. The charged-particle beam apparatus according to claim 1, wherein the gas supplying means includes:
   a gas supply pipe having a distal end provided at the proximal end side of the objective lens;

a gas supplier connected to a proximal end of the gas supply pipe to supply the gas; and a gas supply valve controlling an open/close state of the gas supply pipe.

3. The charged-particle beam apparatus according to claim 2, wherein the gas supply pipe of the gas supplying means is provided with a filter removing dust mixed in the gas supplied from the gas supplier.

4. The charged-particle beam apparatus according to claim 2, wherein in the gas supply pipe of the gas supplying means, at least the distal end arranged inside the cylindrical body comprises a metal.

5. The charged-particle beam apparatus according to claim 2, wherein in the gas supply pipe of the gas supplying means, at least the distal end arranged inside the cylindrical body is subjected to vacuum baking.

6. The charged-particle beam apparatus according to claim 1, further comprising:

a cylindrical body valve interposed between the gas supplying means and the charged-particle supply part to control an open/close state of each of the distal end side and the proximal end side in the cylindrical body; and a supply part evacuating means provided at the proximal end side of the cylindrical body to maintain the proximal end side of the cylindrical body, in which the charged-particle supply part is housed, at an ultra high vacuum state which is higher than a vacuum state of the chamber.

7. The charged-particle beam apparatus according to claim 1, wherein the objective lens further has a magnetic field lens generating a magnetic field so as to superimpose the magnetic field on the electric field generated by the electrostatic lens and converging the charged-particle beam.

8. The charged-particle beam apparatus according to claim 1, wherein the gas supplying means is configured to supply the inert gas at a distal end of the cylindrical body.

9. The charged-particle beam apparatus according to claim 8, wherein the gas supplying means is configured to supply the inert gas such that an atmospheric pressure is created inside the chamber and the distal end of the cylindrical body.

* * * * *